United States Patent
Delia et al.

(10) Patent No.: US 8,737,643 B2
(45) Date of Patent: May 27, 2014

(54) METHOD AND SYSTEM FOR ASSIGNING INDEPENDENT AUDIO VOLUME SETTINGS TO COMPONENTS, CHANNELS, AND MEDIA CONTENT

(75) Inventors: David J. Delia, Lagrangeville, NY (US); Wayne M. Delia, Poughkeepsie, NY (US); Stacey L. Moore, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 1890 days.

(21) Appl. No.: 12/019,211

(22) Filed: Jan. 24, 2008

(65) Prior Publication Data

US 2009/0190778 A1   Jul. 30, 2009

(51) Int. Cl.
*H03G 3/00*  (2006.01)
(52) U.S. Cl.
USPC ............................. 381/104; 330/126; 330/185
(58) Field of Classification Search
USPC .................................................... 381/98–109
See application file for complete search history.

(56) References Cited

U.S. PATENT DOCUMENTS

| | | | |
|---|---|---|---|
| 6,704,421 B1 | 3/2004 | Kitamura | |
| 6,740,803 B2 | 5/2004 | Brinkman et al. | |
| 6,782,107 B1 | 8/2004 | Gleim | |
| 6,909,471 B2 | 6/2005 | Bayley | |
| 2002/0090094 A1* | 7/2002 | Amir et al. | 381/92 |
| 2005/0190931 A1 | 9/2005 | Hsieh | |
| 2005/0210512 A1* | 9/2005 | Anderson et al. | 725/62 |
| 2006/0012720 A1 | 1/2006 | Ding | |

* cited by examiner

*Primary Examiner* — Julio J Maldonado
*Assistant Examiner* — Mohammad Choudhry
(74) *Attorney, Agent, or Firm* — Cantor Colburn LLP

(57) ABSTRACT

A method for amplifier volume specification and control, the method includes: applying an initial volume level to an amplifier; determining one or more of: which A/V component has been selected for use, which channel or frequency is being outputted, and the type of outputted A/V content; modifying the initial amplifier volume level with one or more stored volume level settings in response to at least one of the following: the determined A/V component in use; the selected channel and frequency outputted, and the type of outputted A/V content; wherein the one or more stored volume level settings include: received volume level settings for audio/video (A/V) components; received volume level settings for selected channels and frequencies that are outputted by the A/V components; and received volume level settings for A/V content.

11 Claims, 3 Drawing Sheets

METHOD AND SYSTEM FOR ASSIGNING INDEPENDENT AUDIO VOLUME SETTINGS TO COMPONENTS, CHANNELS, AND MEDIA CONTENT

BACKGROUND OF THE INVENTION

1. Field of the Invention

This invention relates generally to audio/video (A/V) and multimedia devices, and more particularly to a method, apparatus, and system for providing a hierarchical data structure of user preferences to determine amplifier output volume settings for a particular A/V component, a channel/frequency within that component, or for designated prerecorded audio content.

2. Description of the Related Art

Forms of electronic entertainment have proliferated from the early days of radio and phonographs, to include television (TV), analog tape recorders/players (eight track, cassette, video, etc.), compact disc (CD) recorders/players, digital versatile disc (DVD) recorders/players, MP3 (MPEG-1 (moving picture experts group) audio layer 3) devices, personal computers, etc. Forms of the aforementioned audio and video entertainment are commonly found in the home, and are integrated in home entertainment centers. At the heart of many home entertainment centers is a stereo receiver and amplifier sound system that takes the audio outputs from the various entertainment components and provides audio to the user through a set of speakers.

SUMMARY OF THE INVENTION

Embodiments of the present invention include a method, article, and system for amplifier volume specification and control, the method includes: applying an initial volume level to an amplifier; determining one or more of: which A/V component has been selected for use, which channel or frequency is being outputted, and the type of outputted A/V content; modifying the initial amplifier volume level with one or more stored volume level settings in response to at least one of the following: the determined A/V component in use; the selected channel and frequency outputted, and the type of outputted A/V content; wherein the one or more stored volume level settings include: received volume level settings for audio/video (A/V) components; received volume level settings for selected channels and frequencies that are outputted by the A/V components; and received volume level settings for A/V content.

An article comprising one or more computer-readable storage media containing instructions that when executed by a computer enables amplifier volume specification and control; wherein the method further includes: applying an initial volume level to an amplifier; determining one or more of: which A/V component has been selected for use, which channel or frequency is being outputted, and the type of outputted A/V content; modifying the initial amplifier volume level with one or more stored volume level settings in response to at least one of the following: the determined A/V component in use; the selected channel and frequency outputted, and the type of outputted A/V content; wherein the one or more stored volume level settings include: received volume level settings for audio/video (A/V) components; received volume level settings for selected channels and frequencies that are outputted by the A/V components; and received volume level settings for A/V content.

A system for amplifier volume level specification and adjustment, the system includes: an amplifying device with logic and storage devices electrically connected to one or more A/V components; wherein the A/V components are configured for at least one of the following: receiving channel and frequency information for playback through the amplifying device, and for playback of A/V content through the amplifying device; wherein the amplifying device is configured with software for implementing volume level specification and adjustment; wherein the storage devices contain a database of volume settings that are used in the volume level specification and adjustment; wherein the database is used in conjunction with the software and the logic devices to determine which A/V component is being used for playback through the amplifying device, and what the current audio content is; wherein in response to the determination of the playback A/V component and the A/V content, the logic device sends a signal to the amplifying device to adjust the amplifying device's volume setting to match the stored volume setting.

TECHNICAL EFFECTS

As a result of the summarized invention, a solution is technically achieved for a method, article, and system for providing a hierarchical data structure of user preferences to determine amplifier output volume settings for a particular A/V component, a channel/frequency within that component, or for designated prerecorded audio content.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION

Embodiments of the invention provide a method, article and system for providing a hierarchical data structure of user volume preferences in an amplifier, to determine amplifier output volume settings for a particular A/V component, a channel/frequency within that component, or for designated prerecorded audio content. Currently, volume settings on amplifiers in home entertainment audio/video (A/V) systems are limited to a global factory-specified level, or to the previous volume level setting when the entertainment system was last used. In addition, current audio amplifiers provide users with audio balancing adjustment methods to bring all audio to a single pre-selected comfort level regardless of component, channel, or selection that is being played through the amplifier. Furthermore, methods do not currently exist to specify volume settings for different components, TV channels/radio frequencies, music albums, individual music tracks and selections, or other A/V content that are played through an amplifier.

Embodiments of the invention are configured for user specification of initial volume level settings for individual A/V components, individual TV channels, radio frequencies, music compilations and albums, and other A/V content. In embodiments of the invention, an amplifier is initially set at a global default volume level, and a volume level adjustment determination is subsequently made for the A/V component that is selected by the user for playback. A further volume level adjustment determination is made for audio content based on the TV channel, radio channel, or the A/V content to be played through the amplifier. The hierarchy of user defined volume settings that are used in volume level adjustment determinations are stored in a database, wherein the database is used in conjunction with software and logic devices to determine which A/V component is being used, and what the current selected audio content is. In response to a volume setting having been registered in the database, the logic device sends a signal to the amplifier to adjust the volume setting to match the stored volume setting for the selected A/V content.

Figure 1:
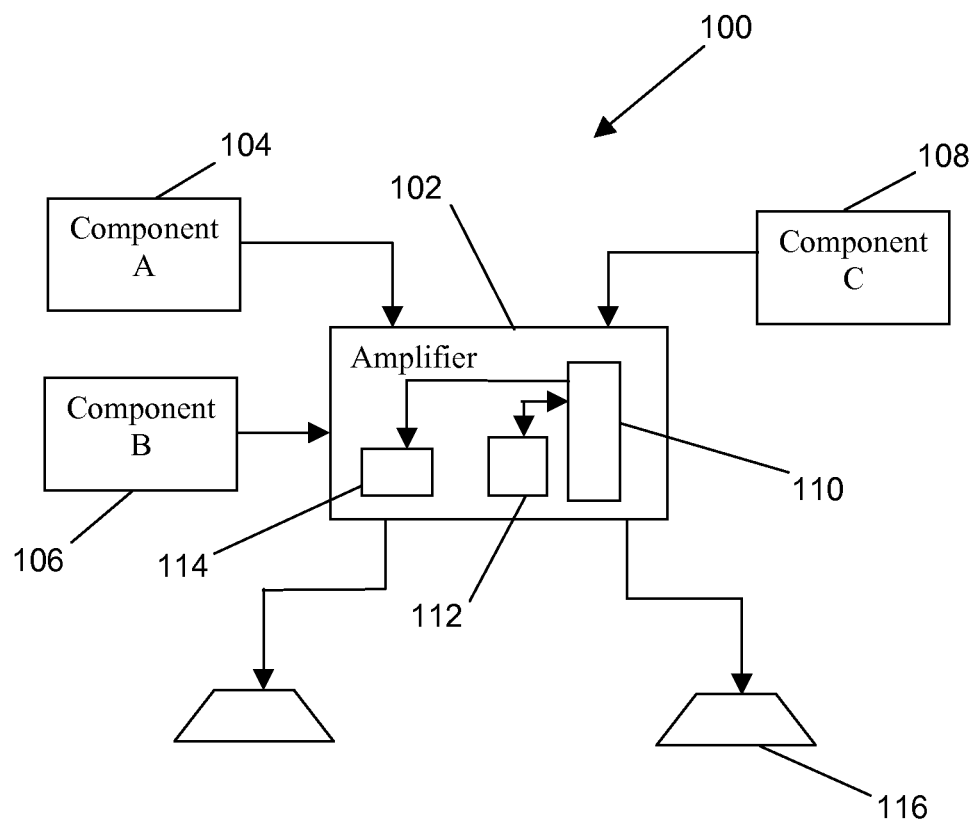
FIG. 1 is a block diagram of an exemplary entertainment system for implementing embodiments of the invention.

FIG. 1 is a block diagram of an exemplary entertainment system 100 for implementing embodiments of the invention. An amplifier 102 is electrically connected to a series of A/V components (104, 106, 108) that represent common consumer electronic devices such as television and radio receivers, DVD, CD, MP3 players, etc. The amplifier 102 has a memory device 112 for storing volume settings in a database for the components, as well as storing volume settings for individual channels, frequencies, A/V content (movies, programs, albums, songs, etc.). A logic device 110 interacts with the memory device 112 for storing and accessing the user volume settings. In addition, the logic device 110 interacts with the amplifier's 102 output stage 114 to control the volume of the audio outputted through the speakers 116.

Table 1 is an example of volume settings that may be stored in memory device 112. The hierarchical volume control is represented in the column labeled as "Level." In Table 1, the system (MediaCenter) and components are first assigned default or user specified global volume settings as exemplified in the setting column. The user may then define volume settings for individual channels, frequencies, and A/V selections as defined in the category and detail columns. For example, the media center amplifier may be set at a default level of 40 decibels (dB), however upon the selection of the television as the playback device, the media center amplifier will be adjusted down to a relative level of 35 decibels (dB). If the user chooses to watch television channel 13, the relative volume level is raised to 50 db, an indication that the station is perceived by the user to have a low level of volume, or that station broadcasts mellow or low key programs that are hard to hear. In a further example, CDs of various albums may be set at varying volume levels by the user, or even may be set by individual songs that are contained within the album.

TABLE 1

| Level | Category | Detail | Setting |
|---|---|---|---|
| MediaCenter | Default | <null> | 40 dB |
| Component | Television | <null> | 35 dB |
| Component | AM Receiver | <null> | 50 dB |
| Component | FM Receiver | <null> | 35 dB |
| Component | CD Player | <null> | 45 dB |
| Component | Tape Player | <null> | 55 dB |
| Component | MP3 | <null> | 40 dB |

TABLE 1-continued

| Level | Category | Detail | Setting |
|---|---|---|---|
| Component | Satellite Radio | <null> | 40 dB |
| Television | Channel | 206 | 30 dB |
| Television | Channel | 13 | 50 dB |
| AM Receiver | Frequency | 880 | 60 dB |
| AM Receiver | Frequency | 660 | 65 dB |
| FM Receiver | Frequency | 101.5 | 50 dB |
| Satellite Radio | Frequency | Howard 100 | 40 dB |
| MP3 | Artist | Ozzy Osbourne | 75 dB |
| MP3 | Artist | Nickelback | 70 dB |
| CD Player | Album | Dark Side of the Moon | 40 dB |
| CD Player | Album | Frampton Comes Alive | 60 dB |
| CD Player | Song | A Hard Day's Night | 50 dB |
| CD Player | Song | Disco Duck | 0 dB |

Examples of situations requiring the application of embodiments of the invention are the following. A television set and a DVD player are routed through a common media center amplifier, with the DVD component having a fixed volume output significantly lower than that of the television set. A volume adjustment is required whenever the amplifier input is switched from the television source to the DVD source, or vice versa. In a second example, different television broadcast channels do not have the same volume level, such as the contrast between a channel specializing in action movies or infomercials with loud volumes contrasted with the relatively muted volume levels of Public Broadcasting Service network stations. In a final example, an MP3 digital music unit contains a wide variety of songs, many recorded at significantly different source data volumes levels, that require volume adjustments when different styles or initial volume recording levels of songs are randomly or sequentially selected.

Figure 2A:
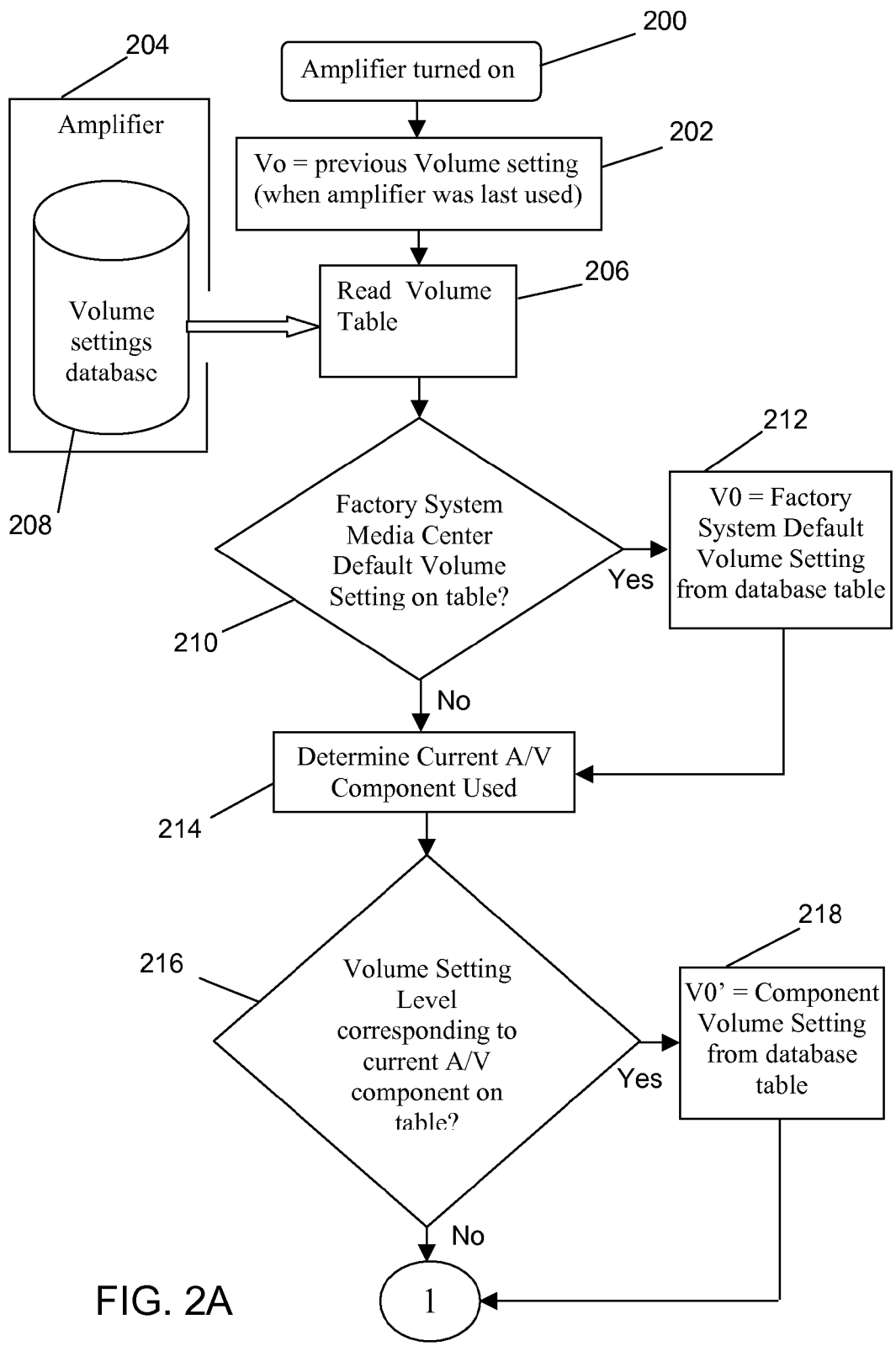
FIG. 2A is a flowchart illustrating the application of system and component level volume settings according to embodiments of the invention.

FIG. 2A is a flowchart illustrating the application of system and component level volume settings according to embodiments of the invention. The process starts when the amplifier is turned on (block 200), and the amplifier initially assumes the volume (Vo) that the amplifier 204 was set to when it was last used (block 202). The volume table is subsequently read (block 206) in the volume settings database 208 within the amplifier 204. If there is a factory system media center default volume (VO) in volume settings database 208 (decision block 210 is Yes) the amplifier is then set to volume VO (block 212). A determination of the current A/V component in use (block 214) is made, and a search is conducted of the volume settings database 208 for user defined volume levels corresponding to the current A/V component. If a volume level has been defined for the A/V component (decision block 216 is Yes), volume level VO is set from the factory system media center default volume VO to VO' to correspond to the volume settings database 208. The hierarchal volume setting process continues in FIG. 2B.

Figure 2B:
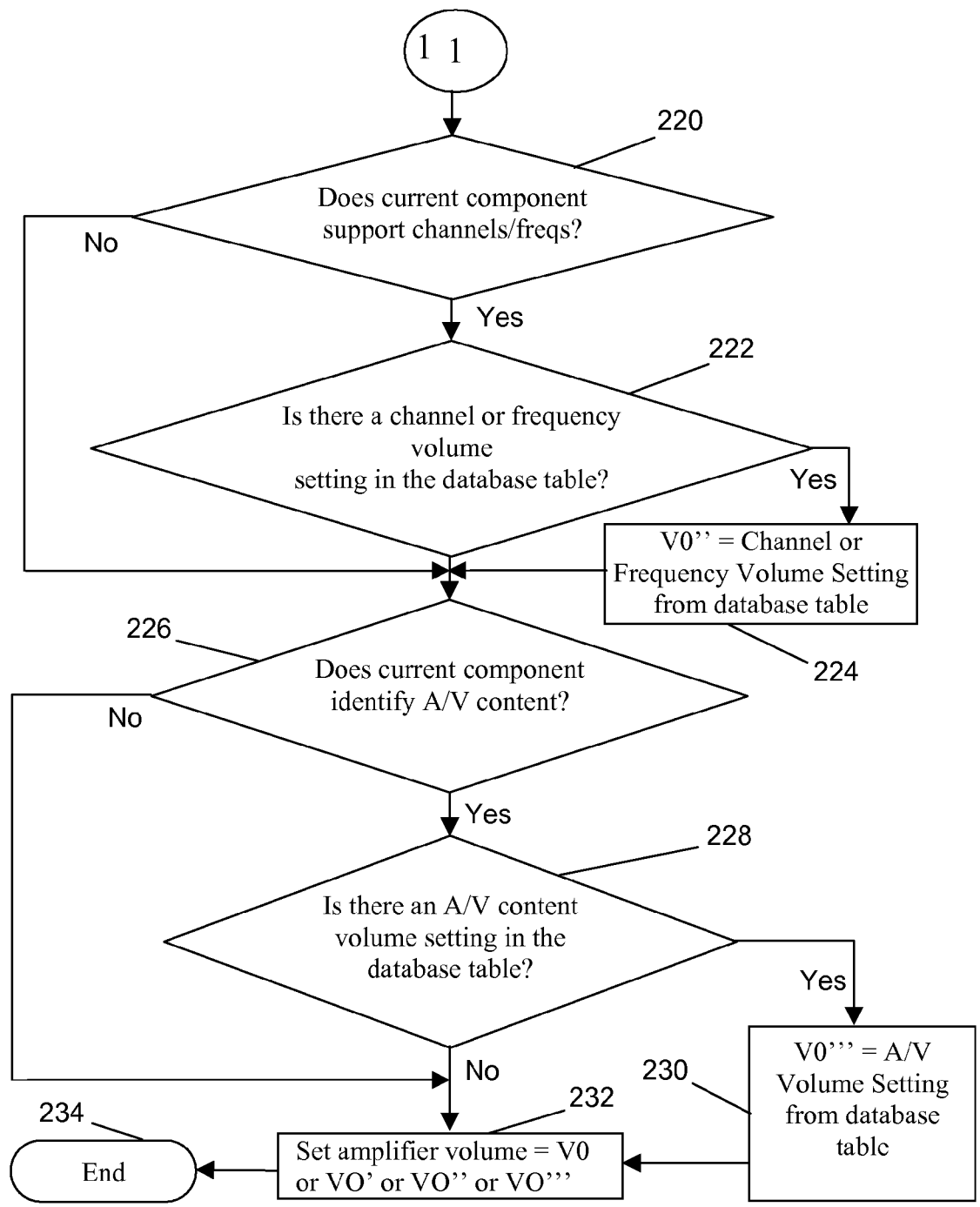
FIG. 2B is a flowchart illustrating the application of content level volume settings according to embodiments of the invention.

FIG. 2B is a flowchart illustrating the application of content level volume settings according to embodiments of the invention. A determination (decision block 220) is made if the current component supports the selection of individual channels or frequencies. If the component does support channels or frequencies (decision block 220 is Yes), a determination is subsequently made if there is a volume setting specified for the channel or frequency by the user in the volume settings database 208 (decision block 222). If there is a frequency or channel setting in the volume settings database 208 (decision block 222 is Yes), the volume VO or VO' is set to VO". A further determination is subsequently made (decision block 226) if the current component supports the identification of A/V content (e.g., television program, CD, DVD, individual song or music track, etc.). When the component supports the identification of A/V content (decision block 226 is Yes), a determination is subsequently made for a volume setting specified for the A/V content by the user in the volume settings database 208 (decision block 228). If there is an A/V content setting in the volume settings database 208 (decision block 228 is Yes), the amplifier volume VO or VO' or VO'' is set to VO''' (block 230 and 232), and the process ends (block 234).

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiments to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for amplifier volume specification and control, the method comprising:
    applying an initial volume level to an amplifier;
    determining one or more of: which A/V component has been selected for use, which channel or frequency is being outputted, and the type of outputted A/V content;
    modifying the initial volume level with one or more stored volume level settings in response to at least one of the following: the determined A/V component in use; the determined channel or frequency outputted, and the determined type of outputted A/V content;
    wherein the one or more stored volume level settings include at least one of the following:
    one or more stored volume level settings corresponding to one or more audio/video (A/V) components;
    one or more stored volume level settings corresponding to one or more channels or frequencies that are outputted by the one or more A/V components; and
    one or more stored volume level settings corresponding to one or more types of A/V content.

2. The method of claim 1, wherein the A/V components are electrically connected to the amplifier.

3. The method of claim 1, wherein the one or more stored volume level settings are stored in a database; and
    wherein the one or more stored volume level settings are defined by individual users.

4. The method of claim 3, wherein the one or more stored volume level settings are stored in a hierarchal manner in the database;
    wherein the hierarchy is based on A/V components, selected channels and frequencies, and A/V content.

5. An article comprising one or more computer-readable storage media containing instructions that when executed by a computer enables amplifier volume specification and control; wherein the method further comprises:
    applying an initial volume level to an amplifier;
    determining one or more of: which A/V component has been selected for use, which channel or frequency is being outputted, and the type of outputted A/V content;
    modifying the initial volume level with one or more stored volume level settings in response to at least one of the following: the determined A/V component in use; the determined channel or frequency outputted, and the determined type of outputted A/V content;
    wherein the one or more stored volume level settings include at least one of the following:
    one or more stored volume level settings corresponding to one or more audio/video (A/V) components;
    one or more stored volume level settings corresponding to one or more selected channels and frequencies that are outputted by the A/V components; and
    one or more stored volume level settings corresponding to one or more types of A/V content.

6. The article of claim 5, wherein the A/V components are electrically connected to the amplifier.

7. The article of claim 5, wherein the one or more stored volume level settings are stored in a database; and
    wherein the one or more stored volume level settings are defined by individual users.

8. The article of claim 7, wherein the one or more stored volume level settings are stored in a hierarchal manner in the database;
    wherein the hierarchy is based on A/V components, channel and frequencies, and A/V content.

9. A system for amplifier volume level specification and adjustment, the system comprising:
    an amplifying device with logic and storage devices electrically connected to one or more A/V components;
    wherein the A/V components are configured for at least one of the following:
    receiving channel and frequency information for playback through the amplifying device, and for playback of A/V content through the amplifying device;
    wherein the amplifying device is configured with software for implementing volume level specification and adjustment;
    wherein the storage devices contain a database of volume settings that are used in the volume level specification and adjustment;
    wherein the database is used in conjunction with the software and the logic devices to determine which A/V component is being used for playback through the amplifying device, and what the current audio content is;
    wherein in response to the determination of the playback A/V component and the A/V content, the logic device sends a signal to the amplifying device to adjust the amplifying device's volume setting to match the stored volume setting.

10. The system of claim 9, wherein the database of volume level settings are stored in a hierarchal manner;
    wherein the hierarchy is based on A/V components, channel and frequencies, and A/V content.

11. The system of claim 9, wherein the volume level settings are defined by individual users.

* * * * *